(12) United States Patent
Martin

(10) Patent No.: US 9,685,818 B2
(45) Date of Patent: Jun. 20, 2017

(54) DEVICE FOR CONVERTING LUMINOUS ENERGY INTO ELECTRICAL ENERGY AND STORING ELECTRICAL ENERGY, AND A METHOD OF MAKING AN ELECTROCHEMICAL CELL

(71) Applicant: COMMISSARIAT A L'ENERGIE ATOMIQUE ET AUX ENE ALT, Paris (FR)

(72) Inventor: Steve Martin, Saint Sauveur (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 97 days.

(21) Appl. No.: 14/422,255

(22) PCT Filed: Aug. 19, 2013

(86) PCT No.: PCT/EP2013/067247
§ 371 (c)(1),
(2) Date: Feb. 18, 2015

(87) PCT Pub. No.: WO2014/029741
PCT Pub. Date: Feb. 27, 2014

(65) Prior Publication Data
US 2015/0214778 A1    Jul. 30, 2015

(30) Foreign Application Priority Data
Aug. 20, 2012  (FR) ...................... 12 57891

(51) Int. Cl.
*H01M 10/44*    (2006.01)
*H01M 10/46*    (2006.01)
(Continued)

(52) U.S. Cl.
CPC .............. *H02J 7/35* (2013.01); *H01L 31/053* (2014.12); *H01M 10/052* (2013.01);
(Continued)

(58) Field of Classification Search
CPC ............... H02J 7/042; H02J 7/355; H02J 7/35
USPC ........ 320/101, 112, 114; 136/251, 254, 255, 136/256
See application file for complete search history.

(56) References Cited

U.S. PATENT DOCUMENTS 4,425,194 A * 1/1984 Kroger .................. H01L 31/068
136/255
4,481,265 A   11/1984 Ezawa et al.
(Continued)

FOREIGN PATENT DOCUMENTS

JP        10-208782 A    8/1998
WO    WO 2009/032986 A2    3/2009

OTHER PUBLICATIONS

International Search Report and Written Opinion issued Dec. 6, 2013 in PCT/EP2013/067247 (with English language translation).
(Continued)

*Primary Examiner* — Edward Tso
(74) *Attorney, Agent, or Firm* — Oblon, McClelland, Maier & Neustadt, L.L.P.

(57) ABSTRACT

An electrochemical and photovoltaic secondary cell formed by an electrolyte provided between a first electrode and a second electrode, the second electrode including a layer based on a semi-conductor material configured to convert photons into electrons.

12 Claims, 5 Drawing Sheets

(51) Int. Cl.
*H02J 7/35* (2006.01)
*H01M 10/052* (2010.01)
*H01M 14/00* (2006.01)
*H01L 31/053* (2014.01)
*H01M 4/38* (2006.01)
*H01M 4/485* (2010.01)
*H01M 4/505* (2010.01)
*H01M 4/525* (2010.01)
*H01M 4/58* (2010.01)

(52) U.S. Cl.
CPC ....... *H01M 10/465* (2013.01); *H01M 14/005* (2013.01); *H01M 4/386* (2013.01); *H01M 4/485* (2013.01); *H01M 4/505* (2013.01); *H01M 4/525* (2013.01); *H01M 4/5825* (2013.01); *Y02E 10/50* (2013.01); *Y02E 60/122* (2013.01); *Y10T 29/49108* (2015.01); *Y10T 29/49115* (2015.01)

(56) References Cited

U.S. PATENT DOCUMENTS 4,916,035 A    4/1990  Yamashita et al.
2003/0127126 A1    7/2003  Yang
2009/0072780 A1    3/2009  Lee et al.
2011/0151326 A1    6/2011  Hirose et al.
2011/0162708 A1*   7/2011  Zhang ................. C09C 1/02
                                                 136/256
2013/0068294 A1*   3/2013  Clark .................. H01G 9/2022
                                                 136/256
2014/0325832 A1    11/2014  Martin et al.

OTHER PUBLICATIONS

French Preliminary Search Report issued May 16, 2013 in Patent Application No. 1257891 (with English translation of categoriesof cited documents).

T. Kanbara, et al. "Photo-Rechargeable solid state battery" Solid State Ionics, vol. 40-41, 1990, pp. 955-958.

S. Licht, et al. "Light invariant, efficient, multiple band gap AlGaAs/Si/metal hydride solar cell" Applied Physics Letters, vol. 74 No. 26, XP12023035A, Jun. 28, 1999, pp. 4055-4057.

D. Protić, et al. "Development of Double-Sided Microstructured Si(Li) Detectors" IEEE Transactions on Nuclear Science, vol. 49, No. 4, Aug. 2002, pp. 1993-1998.

* cited by examiner

DEVICE FOR CONVERTING LUMINOUS ENERGY INTO ELECTRICAL ENERGY AND STORING ELECTRICAL ENERGY, AND A METHOD OF MAKING AN ELECTROCHEMICAL CELL

TECHNICAL FIELD

The invention relates to the field of energy storage, and more particularly to energy storage devices provided with at least one secondary cell coupled with a photovoltaic cell.

STATE OF PRIOR ART

The performance in terms of electrical energy storage of a device formed by photovoltaic cells strongly depends on the sunshine state of the medium wherein this device is placed.

The drawback of this type of device is that it doesn't allow to provide energy during the night and to feed systems requiring strong power peaks.

To overcome this problem, it is known to associate secondary cell type energy storage means with the photovoltaic cells, the secondary cells being recharged by the photovoltaic cells when the luminous energy is sufficient.

Document US 2003/0127126 A1 discloses for example a device wherein a solar cell and a secondary cell are coupled.

It is also known from document WO 2009/032986 to provide a device wherein a solar cell and a secondary electrochemical cell are interconnected and co-integrated on a same support.

Document U.S. Pat. No. 4,481,265 discloses another device with co-integrated photovoltaic cell and secondary cell, the photovoltaic cell being made on a first face of a substrate, whereas the electrochemical secondary cell is provided on a second face of the substrate opposite to the first face.

Document US 2009/072780 presents a structure both enabling converting luminous energy into electrical energy to be made and an electrical energy storage to be implemented.

There is the problem to implement an improved storage energy device provided with an electrochemical secondary cell coupled with a photovoltaic cell.

DISCLOSURE OF THE INVENTION

The present invention first relates to a device for converting luminous energy into electrical energy and for storing electrical energy comprising at least one electrochemical secondary cell, said cell being formed by an electrolyte provided between a first electrode and a second electrode, the second electrode comprising a layer based on a semi-conductor material including a zone adapted to convert photons into electrons.

The cell implemented according to the invention thus both plays the role of an electrochemical secondary cell and a photovoltaic cell.

Thus, a device enabling electrical energy to be produced from luminous energy and this electrical energy to be stored while limiting its overall space is implemented.

Said zone of the layer of semi-conductor material can comprise a PN junction.

This zone includes a first region doped by ions of a species of ions intended to be exchanged between the first electrode and the second electrode.

The zone of said layer of semi-conductor material adapted to convert photons into electrons includes a second doped region facing said first doped region and forming a junction with said doped region.

In the case where said cell is a lithium secondary cell, said first region is doped with Li+ ions.

A first region doping with the species of ions intended to be exchanged between the electrodes of the cell enables in particular a good doping level control to be achieved and a cell with an adjustable doping level to be obtained.

Such a doping can have been made by diffusion by depositing a lithium layer onto the layer of semi-conductor material or upon charging the cell.

According to a possible implementation, the layer of semi-conductor material includes a face called "front face" on which the electrolyte lies and which is in contact with a third doped region, this third doped region having a doping of the same type as that of the first doped region and a concentration of dopants higher than that of the first doped region, and being provided between said front face and said first doped region.

This third doped region enables contacting on the front face of the second electrode to be improved, in particular with an external circuit or means adapted to implement discharging of the secondary cell.

The layer of semi-conductor material includes a back face, opposite said front face, and which is intended to be exposed to a luminous radiation. As a function of the distribution of materials and in particular of the doped layers, a front face illumination or a back face illumination can be achieved.

According to one embodiment, this back face can be in contact with a fourth doped region provided between said back face and said second doped region, the fourth doped region having a doping of the same type as that of the second doped region and a concentration of dopants higher than that of the second doped region.

This fourth doped region enables the contacting on the second electrode to be improved, in particular with an external circuit or means adapted to implement charging of the secondary cell.

The cell can comprise a first contacting zone on a front face of said layer based on a semi-conductor material on which the electrolyte lies, and a second contacting zone on a back face of said layer based on a semi-conductor material intended to be exposed to a luminous radiation.

According to a possible implementation, the back face of the layer based on a semi-conductor material can include an apertured metal element, said second contacting zone being a zone of said apertured metal element.

This apertured metal element can be in the form for example of a comb.

According to a possible implementation, said semi-conductor material can include an additive such as carbon to promote electrical conduction in said semi-conductor material.

The device can further comprise a circuit including:
means for enabling charging of the secondary cell,
means for enabling discharging of the secondary cell,
means for alternately placing the cell in a charging state or in a discharging state.

According to another aspect, the invention relates to a method for making an electrochemical secondary cell comprising forming an electrode of the cell based on a semi-conductor material and means in said semi-conductor material of this electrode for converting photons into electrons.

These means for converting photons into electrons can be formed by at least one PN junction made in said semi-conductor material.

Making means for converting photons into electrons includes a step of doping a region of said semi-conductor material using ions of the species of ions intended to flow between the electrodes of the secondary cell.

This enables in particular the number of steps implemented to make the cell to be reduced.

In the case of a lithium secondary cell, the doping can be a doping using Li+ ions.

According to a possible implementation of the method, this doping can be made by:
depositing a lithium layer,
thermal annealing so as to diffuse Li+ ions in said semi-conductor material.

According to another possible implementation of the method, this doping can be made by:
biasing another electrode of the cell, so as to insert Li+ ions from said other electrode into said semi-conductor material, and then successively modifying said biasing so as to de-insert and then insert again Li+ ions of the semi-conductor material.

BRIEF DESCRIPTION OF THE DRAWINGS

The present invention will be better understood upon reading the description of the exemplary embodiments given merely as an indication and being in no way limiting, making reference to the appended drawings wherein.

Identical, similar or equivalent parts of the different figures bear the same reference numerals so as to facilitate switching from one figure to another.

Different parts represented in the figures are not necessarily drawn at a uniform scale, to make the figures more legible.

DETAILED DISCLOSURE OF PARTICULAR EMBODIMENTS

Figure 1:
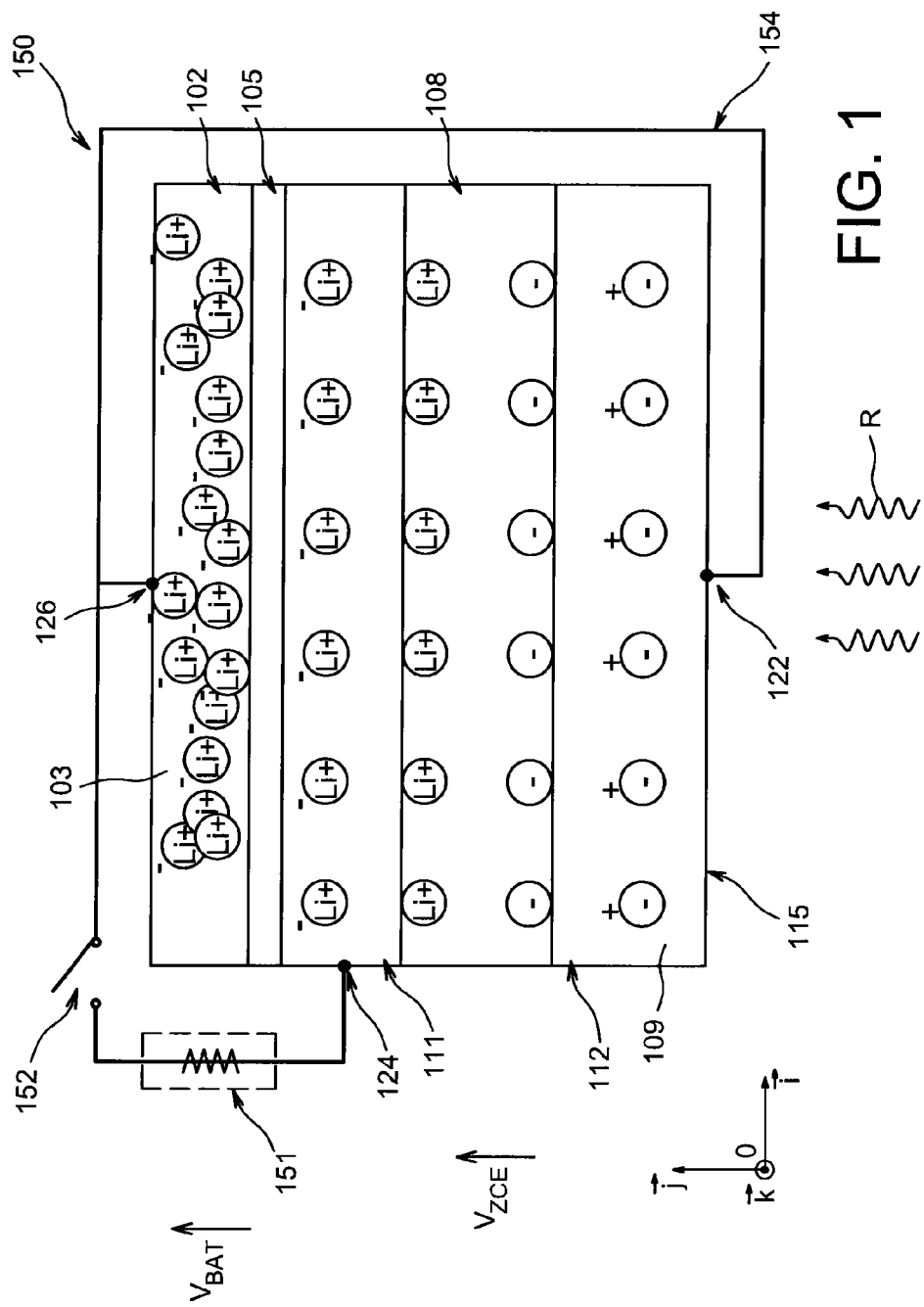
FIG. 1 illustrates a general principle of implementation of a device according to the invention provided with a cell both playing the role of an electrochemical secondary cell and a photovoltaic cell.

An exemplary device provided with an electrochemical secondary cell also forming a photovoltaic cell is illustrated in FIG. 1.

This cell can be made using a stack of thin layers and comprises a first electrode 102 and a second electrode 108 provided on either side of an electrolyte 105.

The first electrode 102 can be formed by at least one first active layer 103 based on an ion and electron conducting material, able to contain at least one species of ions and on the other side to release and/or accept this species of ions.

The cell can be a lithium secondary cell. In this case, the ions intended to flow between the electrodes 102 and 108 are Li+ ions.

The material of the first active layer 103 can be selected as a function of the material from which the second electrode 108 is made. The material of the first layer 103 can be provided so as to have a potential of insertion to said species of ions, for example Li+ ions, higher than or equal to that of the second electrode 108.

Especially in the case where the second electrode 108 is made based on silicon, the first active layer 103 forming the first electrode 102 can be for example based on either one of the following materials: $V_2O_5$, $LiCoO_2$, $LiF_ePO_4$, $TiS_2$, TiOS, $TiO_2$, $Nb_2O_5$, $LiMn_2O_4$, $Li_4Ti_5O_{12}$, $FeS_2$.

It can also be contemplated that the first electrode 102 and the second electrode 108 be based on silicon.

According to a possible embodiment, an additive can be added to the material of the first electrode 102 to improve the ion and/or electron conductivity thereof. This additive can for example be carbon to improve the electron conductivity of the first electrode 102.

The second electrode 108 can itself be formed by a second active layer 109 based on a material able to contain said species of ions and on the other hand to release and/or accept said species of ions, for example Li+ ions.

The second electrode 108 also plays the role of the photovoltaic zone enabling photons to be absorbed and photons to be converted into electrons. The second electrode 108 is based on a semi-conductor material and comprises doped regions 111, 112 forming at least one junction.

The active layer 109 of semi-conductor material comprises a region 111 being doped or likely to be doped by ions belonging to said species of ions intended to pass through the electrolyte 105. This allows a good control, by electrochemical diffusion, of the doping level into the region 111.

This also enables a photovoltaic cell to be implemented with an adjustable doping level.

In the case where a lithium secondary cell is implemented, the semi-conductor material can comprise a region 111 being N-doped using Li+ ions. The semi-conductor material can for example be germanium, silicon or gallium arsenide.

The thickness of the second active layer 109 depends on the optical absorption properties of its material. The latter depend on the chemical nature as well as the morphological properties of the electrode material.

For example, in the case of a second active layer 109 based on a single or polycrystalline silicon, a thickness of several hundred micrometers typically in the order of 100 µm can be provided to form the second electrode 108.

In the case where the active layer 109 is based on an amorphous semi-conductor material, the latter can have a thickness of several hundred nanometers, for example in the order of 500 nm.

The performance in terms of photovoltaic conversion of the active layer 109 depends in particular on its doping profile, and in particular the doping profile of the region being doped by said species of ions intended to flow in the cell, for example lithium ions.

The doping of the second active layer 109 by lithium ions can be achieved at least partly, by electrochemical way, that is, once the stack of layers forming the cell has been made, by operating this cell as a secondary cell, and by implementing a succession of chargings and dischargings of the secondary cell.

To perform a lithiation by electrochemical way, a galvanostatic cycling can for example be conducted, that is with a constant current applied between contacts 122 and 124 illustrated in FIG. 1, the intensity of the current being for example comprised between 100 nA and 1 mA, for example in the order of 10 µA.

The doping of the second active layer 109 can alternatively be made by an intermediate diffusion step consisting in depositing a lithium containing material layer on the active layer 109, and then performing a thermal annealing or treatment.

For this alternative, a lithium layer with a thickness comprised for example between 10 nm and 50 µm can for example be deposited onto the active layer 109, and then a thermal annealing can be performed at a temperature which can be provided lower than 600° C.

Advantageously, the first active layer 103 can be based on a material provided such that an electrochemical potential difference with the material of the second electrode is substantially equal or close to the value of a potential of the space charge zone typically in the order of 0.7 V.

For this, the first active layer 103 can for example be provided based on Si and the active layer 109 based on Ge, or the first active layer 103 can be provided based on Si and the active layer 109 based on Sn.

An electrolyte 105 separates the first electrode 102 from the second electrode 108. This electrolyte 105 can contain a liquid or be in a solid or gel form. The electrolyte 105 can be in the form of a layer or a stack of layers of ion conducting and electron insulating material, for example a glass having the composition: $Li_{2.9}PO_{3.3}N_{0.46}$ commonly called "Lipon®".

The thickness of the electrolyte 105 is selected so as to make it proof to electron flow, but low enough not to be too resistant to ion flow.

The thickness of the electrolyte layer 105 can be for example between 100 nm and 3000 nm and be for example in the order of 2 micrometers.

The electrolyte 105 can be formed using a spraying technique using a magnetron from a target, for example a $Li_3PO_4$ target when this electrolyte is of the "Lipon®" type.

In the case of an electrolyte 105 in the liquid form, this can for example be of the $LiPF_6$ type and comprise an impregnation membrane.

The impregnation membrane can for example be non-woven polypropylene. A microporous separating membrane of polypropylene can also be employed. Such a membrane enables dendrite formation to be avoided.

A circuit comprising means for managing the electrical energy stored by the cell can be provided.

The cell can be connected to a circuit 150 comprising a load 151 likely to be connected to the first electrode 102 via a switch 152 when the secondary cell is placed in a discharging state of its electrical energy.

The circuit 150 can comprise a recharging stage 154 connecting the first electrode 102 and the second electrode 108 to enable the secondary cell to be recharged.

A first contacting zone 124 can be provided on the second electrode 108. This contacting zone 124 can be formed by a high doping of a region of the active layer 109 or by adding (not represented in this figure) one or more electron collecting metal zones in order for example to connect the second electrode 108 to the load 151.

Another contacting zone 122 can also be provided on another zone of the second electrode 108 in order for example to connect the latter to the recharging stage 154.

A third contacting zone 126 can be provided on the first electrode 102 in order to connect the latter to the recharging stage 154 and to the switch 152 of the circuit 150.

The first contact 122 and the third contact 126 can for example be connected together via a conducting element, which can for example be in the form of a connecting metal wire or a connecting zone commonly called "via" passing through the stack of layers and formed for example by a conductive glue.

According to another possibility, the connection between the first contact 122 and the third contact 126 can be set by means of a conductive track deposited for example by a PECVD ("Plasma Enhanced Chemical Vapor Deposition") or PVD ("physical vapor deposition") type vacuum deposition or ink dispensing technique.

According to a possible implementation (not represented) of the cell, to improve photon trapping, the outer face 115 of the second active layer 109, intended to be exposed to a luminous radiation R can be structured or covered with one or more antireflection layers.

One or more antireflection layers can also be provided on the face called "back face" of the second electrode 108 which is intended to be illuminated.

An operating mode of a cell according to the invention both playing the role of a secondary cell and a photovoltaic cell will now be described in connection with FIGS. 2A-2D, in the case where the ions exchanged between the electrodes 102 and 108 and used for doping the semi-conductor material of the second active layer 109 are Li+ ions.

Figure 2A:
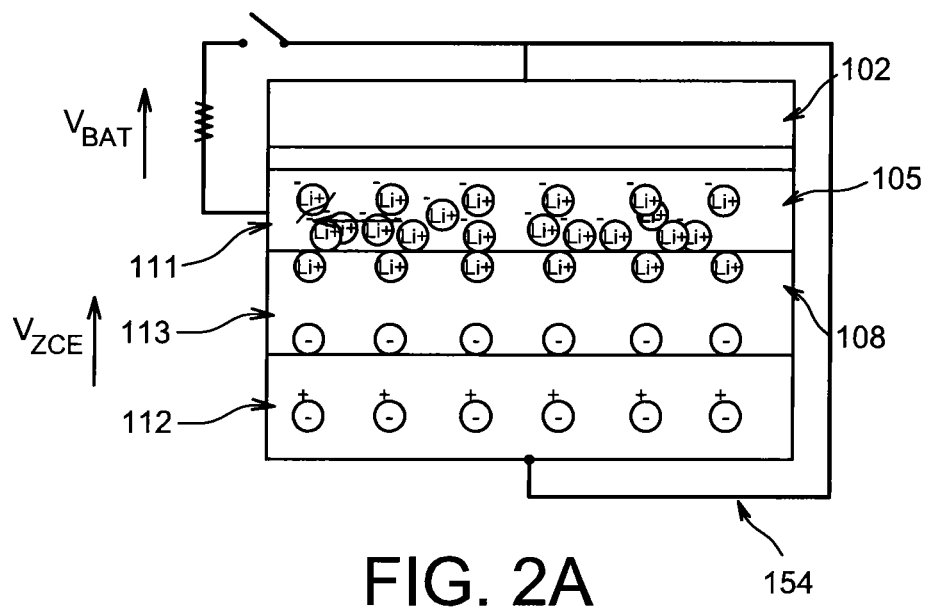
FIGS. 2A-2D illustrate an operating principle of a device according to the invention.
Figure 2B:
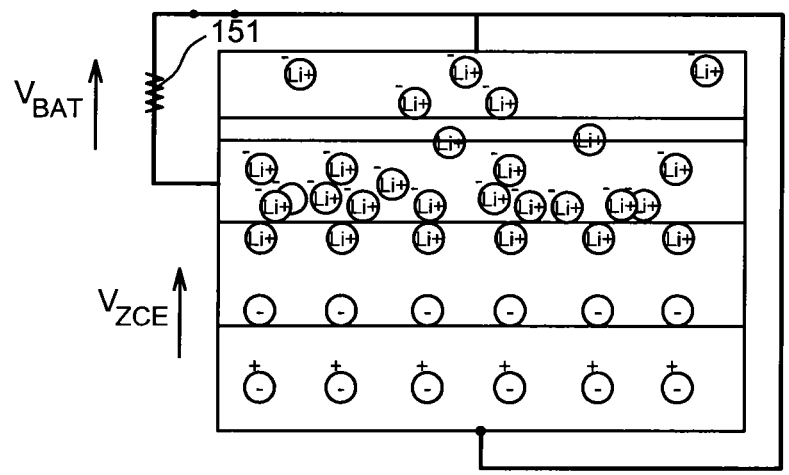

In FIG. 2A, the secondary cell is represented in the charged state. Most of Li+ ions are then in the second electrode 108. The presence as a strong concentration of these Li+ ions in the second electrode 108 modifies the doping nature of the latter in a zone located in the vicinity of the electrolyte 105.

The presence of a N-doped region 111 in a zone of the second electrode 108 located in proximity to the electrolyte 105 and of a P-doped region 112 in another zone located in proximity to the back face of the second electrode intended to be exposed to a luminous radiation leads to the appearance of a space charge zone 113. The presence of an electrical field in this space charge zone prevents the electrons from passing from the second electrode 108 to the first electrode 102 through the circuit element 154.

When a load 151 is connected to the circuit 150 (FIG. 2B), electrons leave the second electrode 108 to join the first electrode 102 by feeding the load 151. The Li+ ions stored in the second electrode 108 migrate to the first electrode 102 by passing through the electrolyte 105, such that the secondary cell is discharging.

Figure 2C:
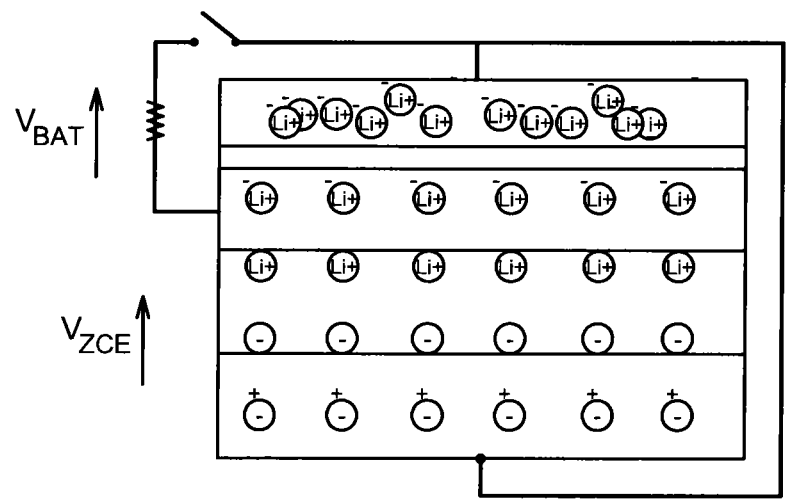

In FIG. 2C, a discharged state is illustrated. In this state, most of the lithium ions are located in the first electrode 102.

Figure 2D:
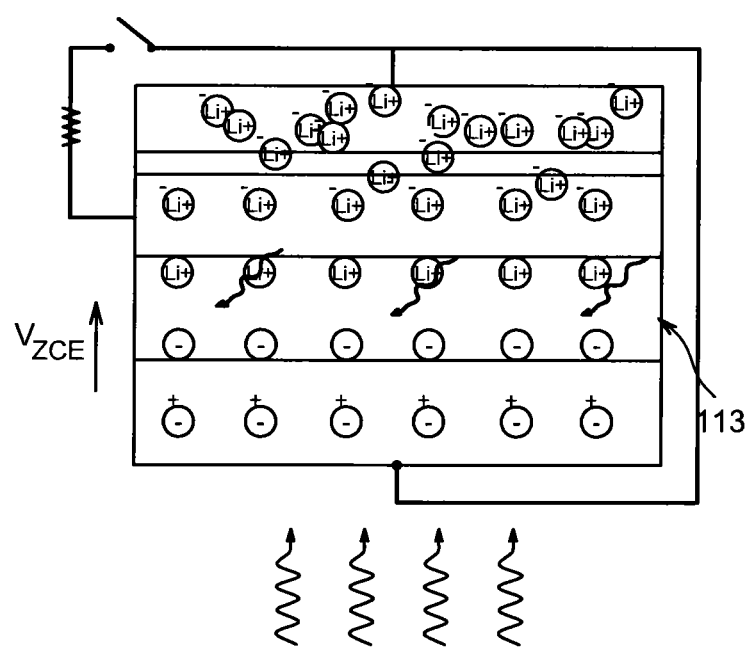

When the cell is exposed to a luminous radiation, an absorption of photons by the second active layer 109 generates electron-hole pairs (FIG. 2D). An electrical field within the space charge zone 113 results in separating the charges. The electrons migrate then to a zone of the second electrode 108 in proximity to the electrolyte 105, whereas the holes migrate in an opposite direction. Lithium ions present in the first electrode 102 in the vicinity of the interface with the electrolyte 105 migrate through the electrolyte 105 in direction of the second electrode 108, so as to keep electrical neutrality. Thus, a recharging of the secondary cell is operating.

The theoretical capacitance $C_{th}$ of the second electrode 108 wherein the photovoltaic absorption zone is formed can be provided at least 5 times higher than the functional capacitance $C_f$ of the secondary cell and preferably at least 100 times higher. Such a condition makes it possible for the semi-conductor material of the active layer 109 to be prevented from being degenerated and to alter the photovoltaic properties of the second electrode 108. By functional capacitance $C_f$, it is intended the maximum capacitance the battery can deliver under a regimen of 1 C. An assessment of a maximum value of this functional capacitance $C_f$ can be achieved by calculating the global lithium amount present in the structure and considering a volume capacitance of this material of 206 µAh/cm²·µm. Alternatively, this functional capacitance can be measured upon discharging the structure at a regimen of 1 C.

Figure 3:
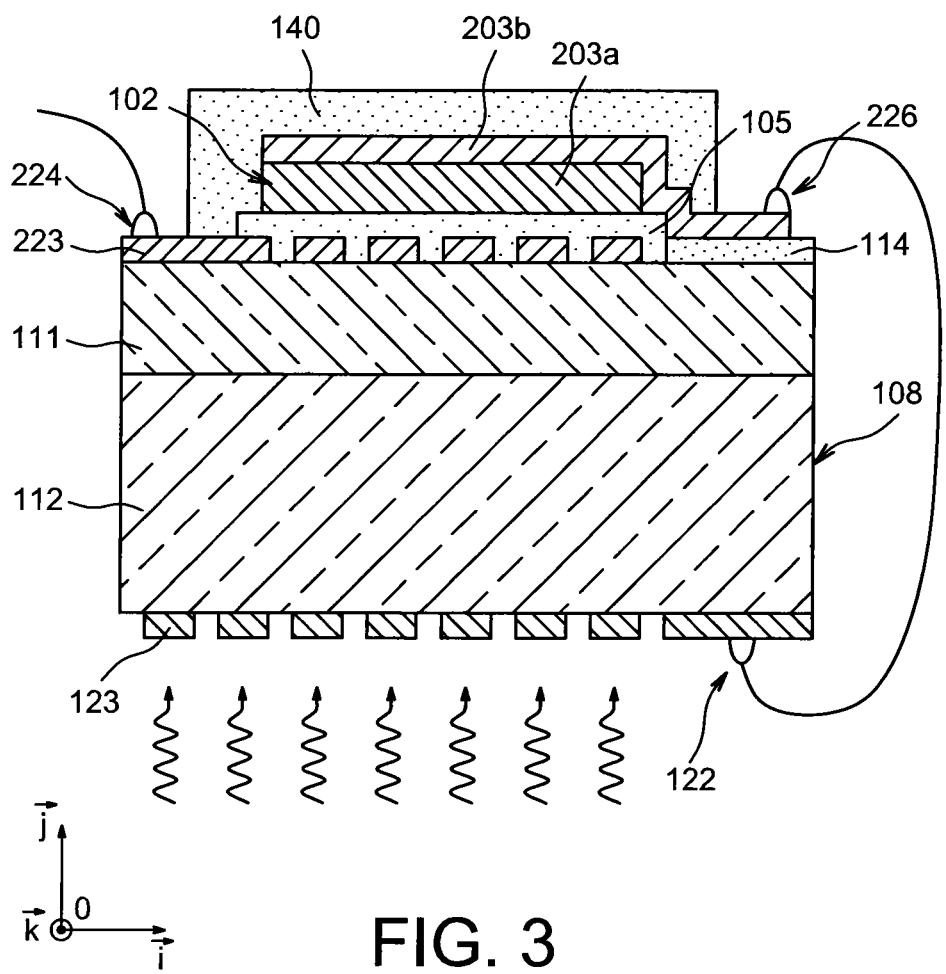
FIG. 3 illustrates a particular example of implementation of a device according to the invention.

By theoretical capacitance $C_{th}$, it is intended a maximum theoretical energy amount the second electrode 108 is able to store, this value being obtainable by the following calculation:

$$C_{th} = Cv * S * e$$

with:

Cv=volume theoretical capacitance of the electrode which can be for example 834 µAh/cm² for silicon with respect to lithium in the phase $Li_{15}Si_4$, S=the area of the second electrode 108 (that is the area of the second electrode 108 measured in a plane parallel to the plane $[O; \vec{i}; \vec{k}]$ on the orthogonal reference frame $[O; \vec{i}; \vec{j}; \vec{k}]$ given in FIG. 3), e=the total thickness of the second electrode 108 (measured in a direction parallel to the vector $\vec{j}$ of the orthogonal reference frame $[O; \vec{i}; \vec{j}; \vec{k}]$.

A particular exemplary embodiment of a photovoltaic cell also forming a secondary cell is illustrated in FIG. 3.

In this example, the cell further includes an encapsulation layer 140 which can be based on an epoxy resin and covers the first electrode 102. This encapsulation layer 140 can act as a moisture barrier.

The first electrode 102 comprises an active layer 203a which can for example be based on $Li_{15}Si_4$ and can have a thickness for example in the order of 1 µm. The first electrode 102 can also have an area for example in the order of 5 cm² (measured in a plane parallel to the plane $[O; \vec{i}; \vec{k}]$ on the orthogonal reference frame $[O; \vec{i}; \vec{j}; \vec{k}]$ given in FIG. 3).

The electrode 102 comprises in this example another layer 203b, for example based on titanium, acting as a collector, and which covers the active layer 203a of the electrode 102 and includes an unstripped portion, which forms a contacting zone 226.

This contacting zone 226 is insulated from the second electrode 108 through a layer of dielectric material for example of the $SiO_2$ type and with a thickness of 300 nm.

The second electrode 108 is in turn formed for example by single crystal silicon, and includes a region 111 N-doped by Li+ ions, as well as a P-doped region 112. The single crystal silicon of the second electrode 108 can have a resistivity for example in the order of 22 Ω·cm. The second electrode 108 has a thickness for example in the order of 100 µm.

The electrolyte 105 provided between the first electrode 102 and the second electrode 108 is for example of the LiPON type and with a thickness in the order of 1 µm.

In this particular example, a contacting zone 122 can be made on a apertured metal zone 123, for example as an aluminium comb, formed on the back face of the second electrode 108, that is the face exposed to a luminous radiation. Apertures between the teeth of the comb enable light to pass through, whereas the teeth enable electron collecting to be ensured at the surface of the semi-conductor material of the electrode 108.

Another contacting zone 224 can be made on a apertured metal zone 223, for example as a TI based comb, provided on the front face of the second electrode 108 opposite the back face exposed to the luminous radiation.

Figure 4:
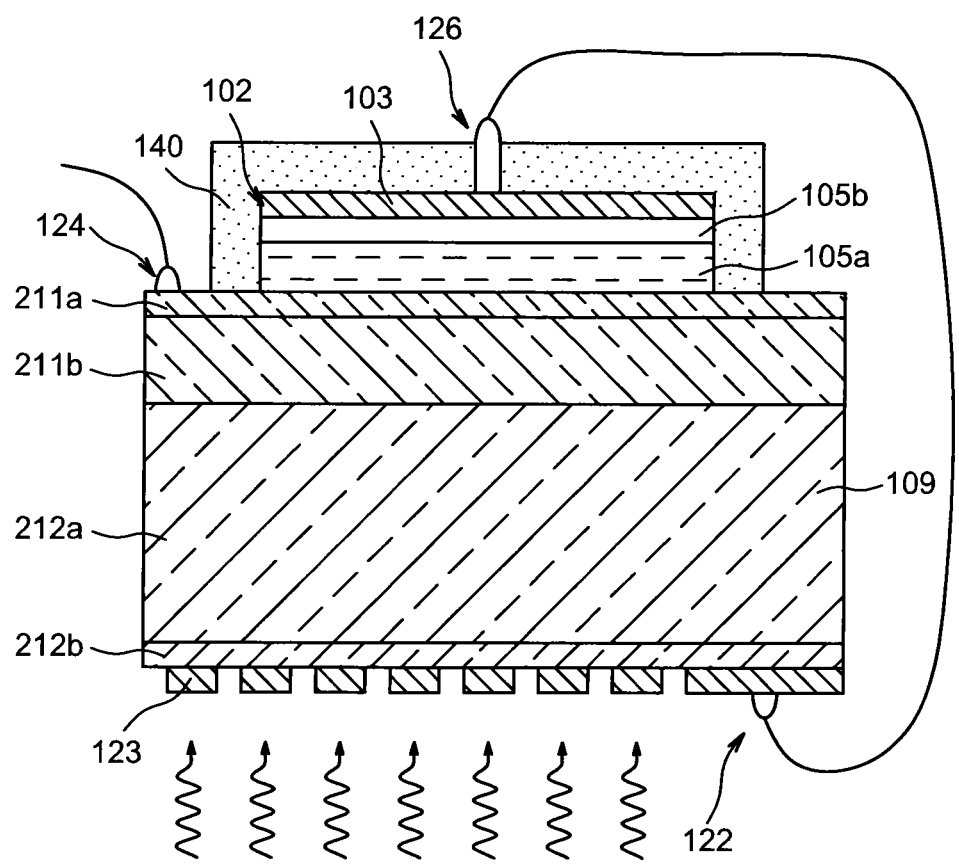
FIG. 4 illustrates another particular example of implementation of a device according to the invention.

Another particular exemplary embodiment of a secondary cell forming a device both playing the role of a photovoltaic and secondary cell is illustrated in FIG. 4.

This example differs from that previously described in particular in that the electrolyte 105 is provided between the electrodes 102, 108. In this example, the electrolyte 105 comprises a liquid solution, for example formed by $LiPF_6$ and an equimolar mixture of ethylene carbonate and diethylene carbonate impregnating a first membrane 105a for example of non-woven polypropylene.

This first membrane 105a is topped by a second membrane 105b for example of polypropylene. The second membrane 105b is in turn topped by the first electrode 102 for example as a $LiCoO_2$ based active layer 103 with a thickness of 50 µm on which a contacting zone 126 can be made. This contacting zone 126 passes through an encapsulation layer 140 forming a hermetic cap and covering the first electrode 102 as well as side zones of the electrolyte 105.

The second electrode 108 can in turn be formed for example of boron doped P-type polycrystalline silicon, and with a thickness for example in the order of 300 µm. The second electrode 108 includes an N-doped region 211a, for example strongly phosphor doped in contact with the front face of the second electrode 102. This region 211a, also in contact with the electrolyte 105, can enable the metal comb of the exemplary embodiment previously given in FIG. 3 to be replaced. A contacting zone 124 can be made on the region 211a, which is also adjoining, and tops, a region 211N N-doped via Li+ ions.

The second electrode 108 also includes a P-doped region 212a, for example boron doped, adjoining the region 211b as well as a strongly P-doped region 212b, for example boron doped, adjoining the back face of the second electrode 108, that is the face of the second electrode 108 intended to receive a luminous radiation. This back face can be covered with a metal zone, for example as an aluminium comb 123 on which a contacting zone 122 is made.

The invention claimed is:

1. A device for converting luminous energy into electrical energy and storing the electrical energy, the device comprising:
    at least one electrochemical secondary cell comprising:
        a first electrode and a second electrode, a given species of ions flowing between the first electrode and the second electrode upon charging or discharging of the cell;
        an electrolyte provided between the first electrode and the second electrode,
        the second electrode comprising a semi-conductor material layer including a zone configured to convert photons into electrons, the layer of semi-conductor material including a first region doped by ions of the given species of ions; and
        a first contacting zone on a front face of the semi-conductor material layer on which the electrolyte is disposed, and a second contacting zone on a back face of the semi-conductor material layer configured to be exposed to the luminous energy.

2. The device according to claim 1, wherein the cell is a lithium secondary cell, and the given species of ions are Li+ ions.

3. The device according to claim 1, wherein the layer of semi-conductor material includes a second doped region facing the first doped region and forms a junction with the doped region.

4. The device according to claim 3, wherein the electrolyte is disposed on the front face, the front face being in contact with a third doped region provided between the front face and the first doped region, the third doped region having a doping of a same type as that of the first doped region and a concentration of dopants that is higher than that of the first doped region.

5. The device according to claim 3, wherein the back face is opposite to the front face, the electrolyte is disposed on the front face, the back face being in contact with a fourth doped region provided between the back face and the second doped region, the fourth doped region having a doping of a same type as that of the second doped region and a concentration of dopants that is higher than that of the second doped region.

6. The device according to claim 1, wherein an apertured metal element is disposed on the back face, the second contacting zone being a zone of the apertured metal element.

7. The device according to claim 6, wherein the cell comprises a contacting zone on a portion of the first electrode isolated from the second electrode via a layer of dielectric material.

8. The device according to claim 1, further comprising circuitry configured to:
    promote charging of the secondary cell,
    promote discharging of the secondary cell, and
    to alternately place the cell in a charging or in a discharging state.

9. A method for making an electrochemical secondary cell, comprising:
    forming an electrode of the cell based on a semi-conductor material that is configured to release and/or to accept at least one species of ions and on a means comprising at least one junction in the semi-conductor material of the electrode that is configured to convert photons into electrons;
    forming the means to convert the photons into the electrons by doping a region of the semi-conductor material by ions of the at least one species of ions; and
    forming a first contacting zone on a front face of the semi-conductor material on which an electrolyte is to be disposed, and a second contacting zone on a back face of the semi-conductor material configured to be exposed to the photons.

10. The method according to claim 9, wherein the at least one species of ions includes Li+ ions.

11. The method according to claim 10, wherein the doping is performed by:
    depositing lithium (Li) layer, and
    thermal annealing to diffuse Li+ ions in the semi-conductor material.

12. The method according to claim 11, wherein the doping using the Li+ ions of the semi-conductor material comprises repeatedly placing the secondary cell in a charging state and in a discharging state.

* * * * *